United States Patent [19]
Dunton

[11] Patent Number: 6,103,634
[45] Date of Patent: Aug. 15, 2000

[54] REMOVAL OF INORGANIC ANTI-REFLECTIVE COATING USING FLUORINE ETCH PROCESS

[75] Inventor: Samuel Vance Dunton, San Jose, Calif.

[73] Assignee: VLSI Technology, Inc., San Jose, Calif.

[21] Appl. No.: 09/215,071

[22] Filed: Dec. 18, 1998

[51] Int. Cl.[7] .................................................. H01L 21/00
[52] U.S. Cl. ...................... 438/724; 438/720; 438/742; 438/744; 216/79
[58] Field of Search .................................. 438/710, 720, 438/723, 724, 725, 743, 744, 742; 216/67, 79

[56] References Cited

U.S. PATENT DOCUMENTS 5,387,312  2/1995  Keller et al. ........................ 438/724 X
6,013,582  1/2000  Ionov et al. ........................ 438/724 X

*Primary Examiner*—William Powell
*Attorney, Agent, or Firm*—Wagner, Murabito & Hao LLP

[57] ABSTRACT

A method for fabricating semiconductor devices that allows for the integration of anti-reflective coatings into the fabrication process. A method for removing an inorganic anti-reflective coating is disclosed that includes the step of exposing the layer of inorganic anti-reflective coating to atomic fluorine. An asher is used to generate fluorine atoms from $NF_3$ precursor gas. The $NF_3$ precursor gas is mixed with an inert carrier such as helium. In one embodiment, sequential etch steps are performed in an asher so as to sequentially remove both a layer of photoresist and a layer of inorganic anti-reflective coating.

21 Claims, 11 Drawing Sheets

```
PLACE SEMICONDUCTOR SUBSTRATE INTO
AN ETCHING DEVICE
                                    201

PERFORM FIRST ETCHING STEP BY INTRODUCING A FIRST CHEMICAL
INTO THE ETCHING DEVICE FOR REMOVING PHOTORESIST
                                                          202

PERFORM SECOND ETCHING STEP BY INTRODUCING A SECOND CHEMICAL
INTO THE ETCHING DEVICE SO AS TO GENERATE FLUORINE ATOMS FOR
REMOVING INORGANIC ANTI-REFLECTIVE COATING
                                                           203
```

```
┌─────────────────────────────────────┐
│  PLACE SEMICONDUCTOR SUBSTRATE INTO │
│         AN ETCHING DEVICE           │
│                                 201 │
└─────────────────────────────────────┘
                   │
┌──────────────────────────────────────────────────┐
│ PERFORM FIRST ETCHING STEP BY INTRODUCING A FIRST CHEMICAL │
│  INTO THE ETCHING DEVICE FOR REMOVING PHOTORESIST │
│                                              202 │
└──────────────────────────────────────────────────┘
                   │
┌────────────────────────────────────────────────────┐
│ PERFORM SECOND ETCHING STEP BY INTRODUCING A SECOND CHEMICAL │
│ INTO THE ETCHING DEVICE SO AS TO GENERATE FLUORINE ATOMS FOR │
│      REMOVING INORGANIC ANTI-REFLECTIVE COATING    │
│                                                203 │
└────────────────────────────────────────────────────┘
```

FIG. 2

```
┌─────────────────────────────────────────────┐
│ DEPOSIT LAYER OF METAL OVER SEMICONDUCTOR   │
│                SUBSTRATE                    │
│                                         301 │
└─────────────────────┬───────────────────────┘
                      │
┌─────────────────────┴───────────────────────┐
│ DEPOSIT LAYER OF INORGANIC ANTI-REFLECTIVE COATING │
│                                         302 │
└─────────────────────┬───────────────────────┘
                      │
┌─────────────────────┴───────────────────────┐
│          DEPOSIT LAYER OF PHOTORESIST       │
│                                         303 │
└─────────────────────┬───────────────────────┘
                      │
┌─────────────────────┴───────────────────────┐
│          PATTERN LAYER OF PHOTORESIST       │
│                                         304 │
└─────────────────────┬───────────────────────┘
                      │
┌─────────────────────┴───────────────────────┐
│ PERFORM FIRST ETCH STEP SO AS TO SELECTIVELY ETCH │
│                LAYER OF METAL               │
│                                         305 │
└─────────────────────┬───────────────────────┘
                      │
┌─────────────────────┴───────────────────────┐
│ PLACE SEMICONDUCTOR SUBSTRATE INTO AN ETCHING │
│                   DEVICE                    │
│                                         306 │
└─────────────────────┬───────────────────────┘
                      │
┌─────────────────────┴───────────────────────┐
│     PERFORM SECOND ETCH STEP BY INTRODUCING │
│ CHEMICAL INTO ETCHING DEVICE FOR REMOVING LAYER │
│              OF PHOTORESIST                 │
│                                         307 │
└─────────────────────┬───────────────────────┘
                      │
┌─────────────────────┴───────────────────────┐
│ PERFORM THIRD ETCH STEP BY INTRODUCING CHEMICAL │
│ INTO ETCHING DEVICE SO AS TO GENERATE FLUORINE │
│ ATOMS FOR REMOVING LAYER OF INORGANIC ANTI- │
│              REFLECTIVE COATING             │
│                                         308 │
└─────────────────────────────────────────────┘
```

FIG. 3

REMOVAL OF INORGANIC ANTI-REFLECTIVE COATING USING FLUORINE ETCH PROCESS

TECHNICAL FIELD

The present invention generally pertains to the field of semiconductor devices. More particularly, the present invention relates for a method for removing an inorganic anti-reflective coating.

BACKGROUND ART

The manufacture of 0.018 micron and smaller semiconductor devices has led to the use of anti-reflective coatings. These anti-reflective coatings prevent reflection of the wavelength of interest when patterning photoresist. This allows for the formation of 0.18 micron and smaller devices and structures.

Typically, anti-reflective coatings are made of inorganic material. In one prior art fabrication process, the anti-reflective coating is deposited using plasma enhanced chemical vapor deposition, and is followed by a layer of photoresist. Subsequent patterning results in uniform and accurate exposure of photoresist. However, this process is difficult to integrate into the overall fabrication process because the anti-reflective coating is difficult to remove. More particularly, the anti-reflective coating is harder than the material commonly used to form dielectric layers, stoichiometric $SiO_2$. Also, the anti-reflective coating etches differently than stochiometric $SiO_2$.

One method for removal of the anti-reflective coating involves the deposition of a $SiO_2$ interlevel dielectric layer over the anti-reflective coating layer. The $SiO_2$ is then masked, patterned and etched to form vias that expose the anti-reflective coating. The anti-reflective coating is then etched using a standard $SiO_2$ etch chemistry. Because, $SiO_2$ etches more easily than the anti-reflective coating, undesired removal of $SiO_2$ may result at locations where vias are not perfected landed (i.e. misaligned) on top of metal. This undesired removal of $SiO_2$ leads to nonuniform vias and excessively overhanging vias. This, in turn leads to nonuniform plugs and can result in less than desirable electrical characteristics.

Alternatively, a dedicated etch step can be used to remove the anti-reflective coating. This dedicated etch step is typically used following a conventional oxide etch step. One prior dedicated etch step includes a $SiO_2$ etch step specifically tailored for etch selectivity to the inorganic anti-reflective coating. However, such prior art processes are expensive due to the additional required etch step. Also, the additional etch step may still result in undesired removal of $SiO_2$. Moreover, the additional etch step results in disruption of the fabrication process and involves additional cost while deleteriously affecting throughput.

Thus, a need exists for a method for fabricating semiconductor devices that allows for the integration of anti-reflective coatings into the fabrication process. Also, a method for fabricating semiconductor devices is needed that will allow for the efficient and inexpensive removal of anti-reflective coatings. In addition, a method for removing a layer of anti-reflective coating is needed that does not result in undesired removal of dielectric material. Moreover, a need exists for a method for the removal of an inorganic non-reflective coating that results in minimal disruption of the fabrication process. The present invention provides a solution to the above needs.

DISCLOSURE OF THE INVENTION

The present invention provides a method for fabricating semiconductor devices that allows for the integration of anti-reflective coatings into the fabrication process. The present invention provides a method that meets the above-listed need and that allows for the efficient and inexpensive removal of anti-reflective coatings. Also, the present invention provides a method that meets the above-listed needs and that does not result in undesired removal of dielectric material.

Specifically, in one embodiment of the present invention a method for removing a layer of inorganic anti-reflective coating is disclosed that includes the step of exposing the layer of inorganic anti-reflective coating to atomic fluorine. An etcher is used to generate fluorine atoms from $NF_3$ precursor gas. In one embodiment, the $NF_3$ precursor gas is mixed with an inert carrier such as helium.

In another embodiment, the present invention includes the features of the above-described embodiment in a fabrication process that includes the steps of removing a layer of photoresist in an etcher and changing the chemistry in the etcher to remove the inorganic anti-reflective coating. This allows for the efficient and inexpensive removal of the inorganic anti-reflective coating without the need for an expensive additional process step.

In another embodiment, the present invention includes the features of the above-described embodiment in a fabrication process that includes the steps of depositing a metal layer, depositing a layer of inorganic anti-reflective coating, and depositing a layer of photoresist. The layer of photoresist is patterned and the layer of inorganic anti-reflective coating, the layer of photoresist and the metal layer are etched. This forms an interconnect which is overlain by the remaining portion of the layer of inorganic anti-reflective coating and the remaining portion of the layer of photoresist.

The semiconductor substrate is placed into an etcher. The remaining photoresist is removed using an etch step. The etch chemistry in the etcher is then changed so that the etcher generates fluorine atoms that remove the layer of inorganic anti-reflective coating.

An inter-level dielectric layer can then be deposited, masked and etched so as to form vias. Since the layer of inorganic anti-reflective coating is removed prior to the deposition of the inter-level dielectric layer, there is no need to etch a layer of inorganic anti-reflective coating after forming the vias as is required in prior art processes. Thus, undesired removal of $SiO_2$ does not result as in prior art methods.

Also, because the layer of inorganic anti-reflective coating is removed prior to the deposition of the interlevel dielectric, a $SiO_2$ etch step specifically tailored for etch selectivity to the inorganic anti-reflective coating is not required. This results in cost savings and eliminates an expensive process step over prior art methods that use a dedicated $SiO_2$ etch step that is specifically tailored for etch selectivity to the inorganic anti-reflective coating and that is performed in a separate etch chamber.

Thus, the present invention provides a method for fabricating semiconductor devices that allows for the integration of anti-reflective coatings into the fabrication process. Also, the present invention provides method for fabricating semiconductor devices that allows for the efficient and inexpensive removal of anti-reflective coatings that results in minimal disruption of the fabrication process. Also, the present invention provides a method for removing a layer of anti-reflective coating that does not result in undesired removal of $SiO_2$.

These and other advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 2 is a flow chart illustrating a method for removing a layer of photoresist and a layer of inorganic anti-reflective coating from a semiconductor substrate in accordance with one embodiment of the present invention.

FIG. 3 is a flow chart of steps performed in accordance with one embodiment of the present claimed invention.

The drawings referred to in this description should be understood as not being drawn to scale except if specifically noted.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Figure 1:
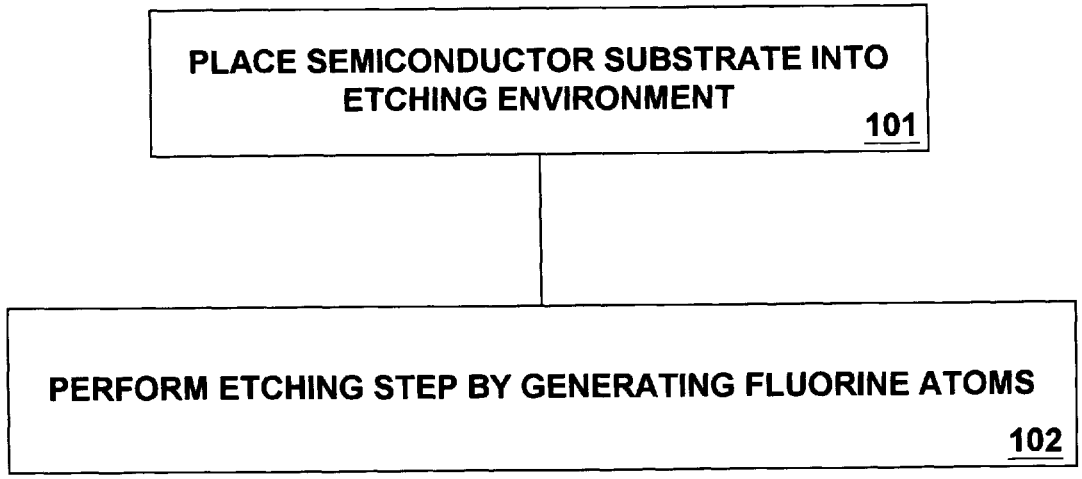
FIG. 1 is a flow chart illustrating a method for removing a layer of inorganic anti-reflective coating from a semiconductor substrate in accordance with one embodiment of the present invention.

Referring now to FIG. 1, a method for removing a layer of inorganic anti-reflective coating from a semiconductor substrate is illustrated according to one embodiment of the present invention. First, as shown by step 101, a semiconductor substrate, on which a layer of inorganic anti-reflective coating is disposed, is placed into an etching environment. Then, as shown by step 102, an etching step is performed. This etching step is performed by introducing a chemical into the etching device so as to generate fluorine atoms. In one embodiment, $NF_3$ is introduced into the etching device as a precursor chemical. An inert carrier gas may also be introduced into the etching chamber such as, for example helium. The etching step may be performed at any pressure. However, in one embodiment, the etching environment has a pressure of between 0.0001 torr and 1.7 torr. In one embodiment, additional oxygen gas is not introduced into the etch environment. The in $NF_3$ produces fluorine atoms that remove the layer of inorganic anti-reflective coating.

The terms "etcher," "etching chamber" and "etching device" as used in the present invention specifically includes an asher, a plasma reactor, a reactive ion etcher, sputter etching devices and the like. Similarly, the terms "etching" includes processes adapted to convert chemicals into their constituent atoms such as, for example, reactive ion etch methods, ashing methods, and specifically includes any method for selectively generating oxygen atoms and/or fluorine atoms.

Continuing with FIG. 1, in one embodiment, the etching device is an asher. The asher includes a remote plasma that generates atomic fluorine. However, alternatively, the etch process of the present invention can be performed in any device that generates atomic fluorine.

The etch process of the present invention gives a highly selective etch. That is, the etch process of the present invention preferentially etches inorganic anti-reflective coating while minimally etching $SiO_2$. The etch process of the present invention has been found to etch (inorganic anti-reflective coating: $SiO_2$) with etch selectivity as high as 20:1.

The method of removing inorganic anti-reflective coating of the present invention is well adapted for use in a process that removes both a layer of photoresist and a layer of inorganic anti-reflective coating. FIG. 2 shows a method for removing a layer of inorganic anti-reflective coating from a semiconductor substrate on which a photoresist layer and a layer of inorganic anti-reflective coating are disposed. First, as shown by step 201, the semiconductor substrate is disposed in an etching device.

Continuing with FIG. 2, as shown by step 202, a first etching step is then performed by introducing a first chemical into the etching device that is adapted to remove photoresist. In one embodiment, this first chemical is oxygen gas that is decomposed into oxygen atoms that remove the layer of photoresist.

Still referring to FIG. 2, a second etching step is then performed as shown by step 203. In the second etching step, a second chemical is introduced into the etching device so as to generate fluorine atoms. In one embodiment, $NF_3$ is introduced into the etching device as a precursor chemical. An inert carrier gas may also be introduced into the etching chamber such as, for example, helium. The etch process and does not include any introduction of oxygen gas into the etching environment. Any pressure can be used. However, it has been found that a pressure of between 0.0001 torr and 1.7 torr gives good results. The $NF_3$ produces fluorine atoms that remove the layer of inorganic anti-reflective coating.

Continuing with FIG. 2, in one embodiment, the etching device is an asher. In this embodiment, the first etching step 202 and second etching step 203 are sequentially performed ashing steps that operate to sequentially remove the layer of photoresist and the layer of inorganic anti-reflective coating.

Numerous advantages are obtained by sequentially removing the layer of photoresist and the layer of inorganic anti-reflective coating. Cost savings and throughput increases result from the fact that there is no need to perform a complex, separate etch step. That is, there is no need to remove the semiconductor substrate from the etcher and place it into a separate etch chamber as is required by prior art processes for removing inorganic anti-reflective coatings. Also, there is no need to perform a complex selective dedicated etch process such as prior art processes that achieve the selective etching of silicon by careful manipulation of $NF_3$—$O_2$ gas chemistry.

In FIG. 3, the methods shown in FIGS. 1 and 2 are applied to a specific semiconductor fabrication process. First, as shown by step 301, a layer of metal is deposited over the semiconductor substrate. The layer of metal at least partially overlies regions that contain dielectric material such as, for example, $SiO_2$.

Figure 4A:
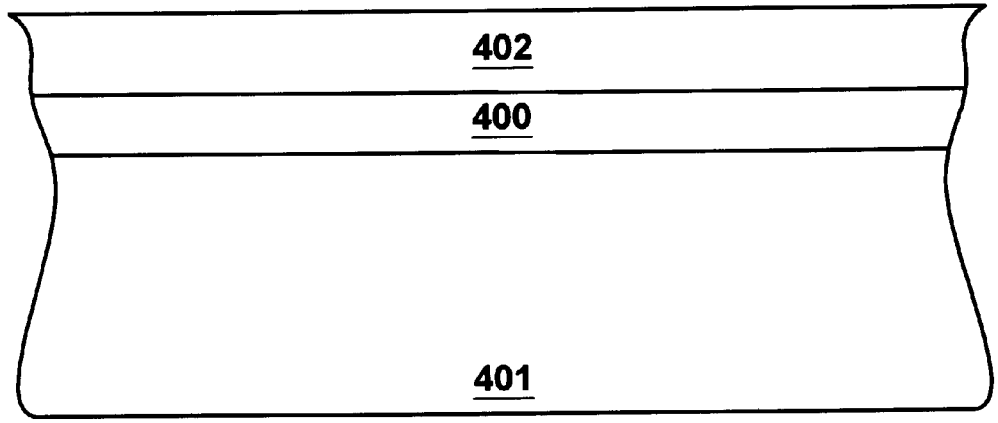
FIG. 4A shows a representative semiconductor substrate after the performance of step 301 of FIG. 3 in accordance with one embodiment of the present claimed invention.

FIG. 4A shows a representative semiconductor substrate 401 over which metal layer 402 is deposited. Metal layer 402 is shown to overlie $SiO_2$ layer 400.

A layer of inorganic anti-reflective coating is then deposited as shown by step 302 of FIG. 3. In one embodiment, layer of inorganic anti-reflective coating 403 is deposited using plasma-enhanced chemical vapor deposition using mixtures of silane ($SiH_4$) and $N_2O$ source gases to form a hydrogenated silicon rich oxide film. This hydrogenated silicon rich oxide film is sometimes referred to as "SiON." However, in actuality, the film contains little or no nitrogen. Rather, the film contains hydrogen that is incorporated into the film during the deposition process.

Figure 4B:
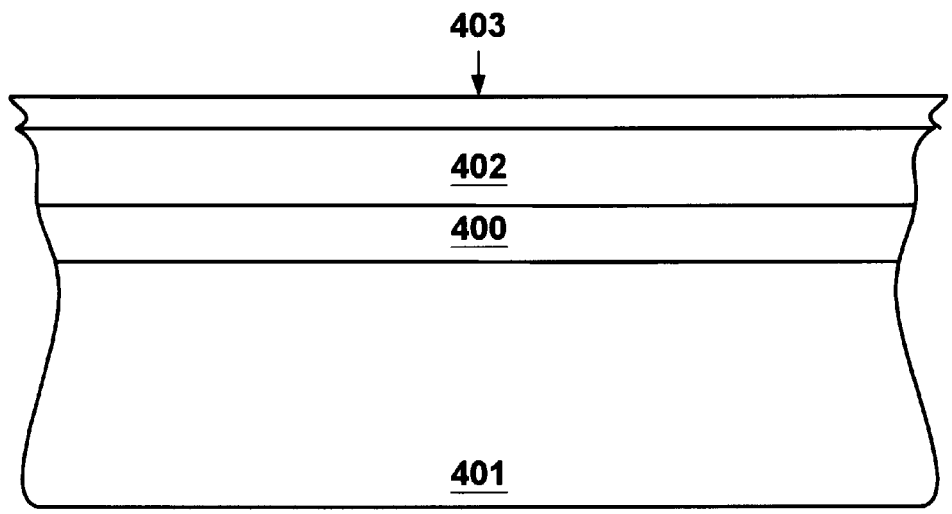
FIG. 4B shows a representative semiconductor substrate after the performance of step 302 of FIG. 3 in accordance with one embodiment of the present claimed invention.

FIG. 4B shows the semiconductor substrate of FIG. 4A after step 302 is performed. Layer of inorganic anti-reflective coating 403 is shown to be deposited such that it directly overlies metal layer 402.

Figure 4C:
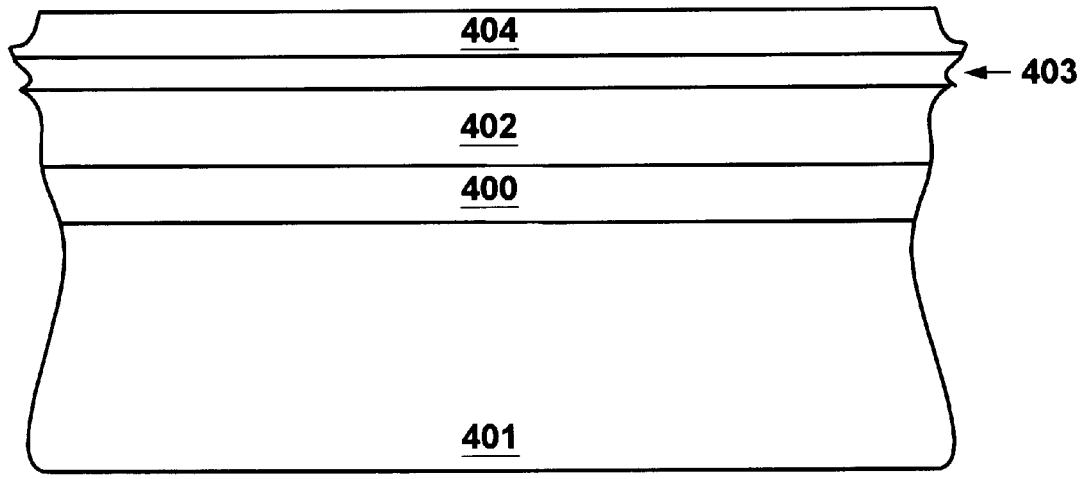
FIG. 4C shows a representative semiconductor substrate after the performance of step 303 of FIG. 3 in accordance with one embodiment of the present claimed invention.

Referring back to FIG. 3, a layer of photoresist is deposited as is shown by step 303. FIG. 4C shows the semiconductor substrate of FIG. 4B after step 303 is performed. Layer of photoresist 404 is shown to be deposited such that it directly overlies layer of inorganic anti-reflective coating 403.

Continuing with FIG. 3, the layer photoresist is patterned as shown by step 304. That is, the layer of photoresist is selectively exposed to light so as to produce exposed regions and unexposed regions.

Still referring to FIG. 3, as shown by step 305, a first etch step is performed so as to selectively etch the layer of photoresist, the layer of organic anti-reflective coating and the layer of metal. The combination of steps 304–305 produces a desired pattern of metal over the semiconductor substrate. The patterning of the layer of photoresist (step 304) defines those regions of the layer of metal that will be etched by etch step 305.

Figure 4D:
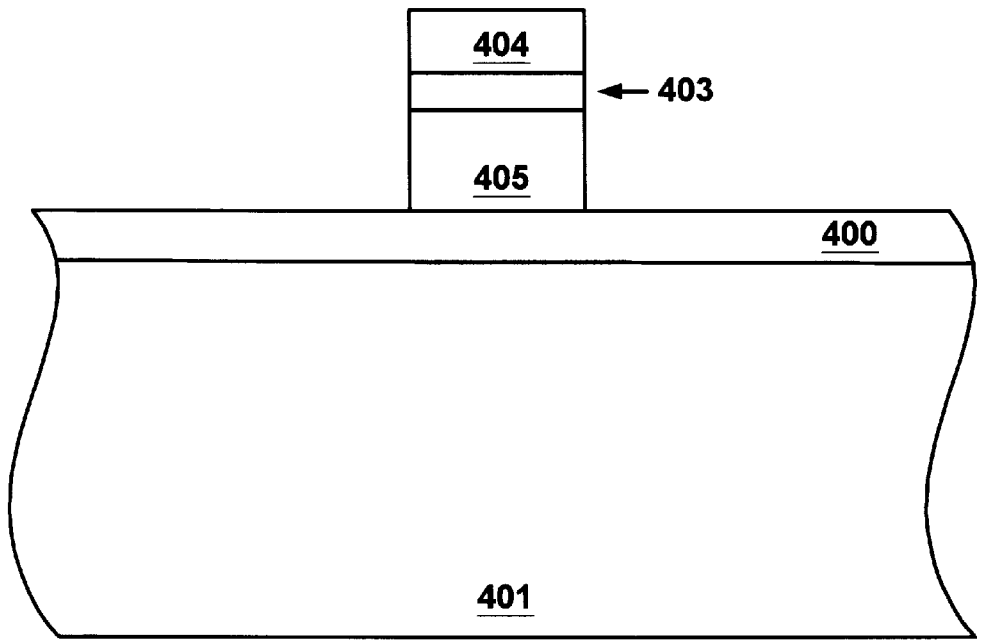
FIG. 4D shows a representative semiconductor substrate after the performance of steps 304–305 of FIG. 3 in accordance with one embodiment of the present claimed invention.

Referring now to FIG. 4D, the semiconductor substrate of FIG. 4C is shown after steps 304–305 form interconnect 405. A remaining portion of layer of inorganic anti-reflective coating 403 overlies interconnect 404. Similarly, a remaining portion of layer of photoresist 404 overlies the remaining portion of layer of inorganic anti-reflective coating 403.

As shown by step 306 of FIG. 3, the semiconductor substrate is placed into an etching device. In one embodiment, the etching device is an asher.

Next, a shown by steps 307–308 sequential etch steps are performed so as to remove the layer of photoresist and the layer of inorganic anti-reflective coating. First, as shown by step 307, a second etch step is performed. This etch step is performed by introducing a first precursor chemical into the etching device for removing the layer of photoresist. In one embodiment, the first precursor chemical includes oxygen gas that is decomposed into oxygen atoms that remove the layer of photoresist.

Figure 4E:
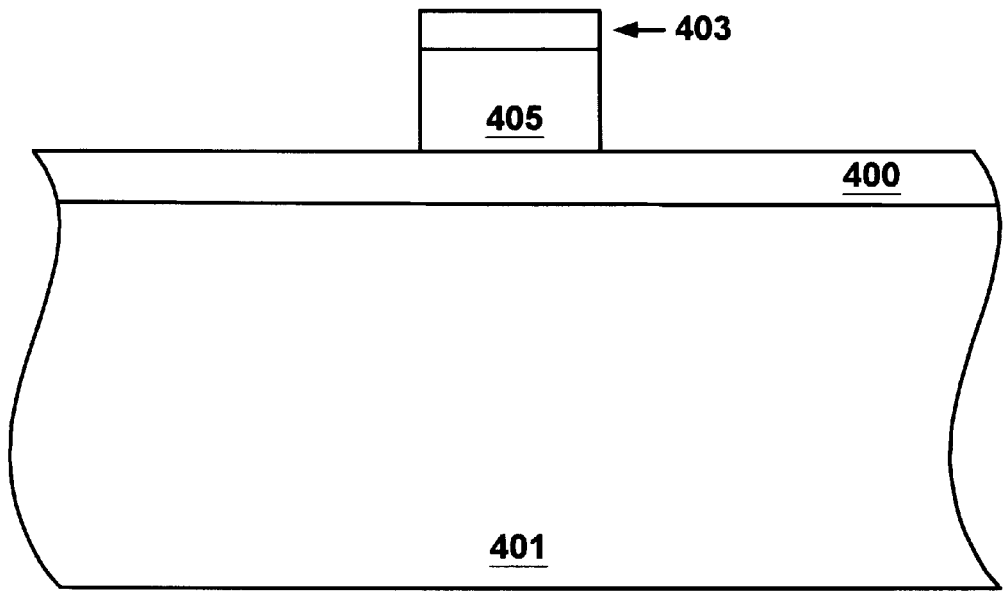
FIG. 4E shows a representative semiconductor substrate after the performance of step 307 of FIG. 3 in accordance with one embodiment of the present claimed invention.

Referring now to FIG. 4E, the semiconductor substrate of FIG. 4D is shown after step 307 has removed the remaining portion of layer of photoresist 404. This leaves interconnect 405 which is overlain by the remaining portion of inorganic anti-reflective coating 403.

Still referring to FIG. 3, a third etch step is then performed as shown by step 308. In the third etch step, a second chemical is introduced into the etching device so as to generate fluorine atoms. In one embodiment, $NF_3$ is introduced into the etching device as a precursor chemical. An inert carrier gas may also be introduced into the etching chamber such as, for example helium. In one embodiment, the etching environment has a pressure of between 0.0001 torr and 1.7 torr and is an environment that does not include any introduction of oxygen gas into the etching environment. The $NF_3$ produces fluorine atoms that remove the layer of inorganic anti-reflective coating.

Figure 4F:
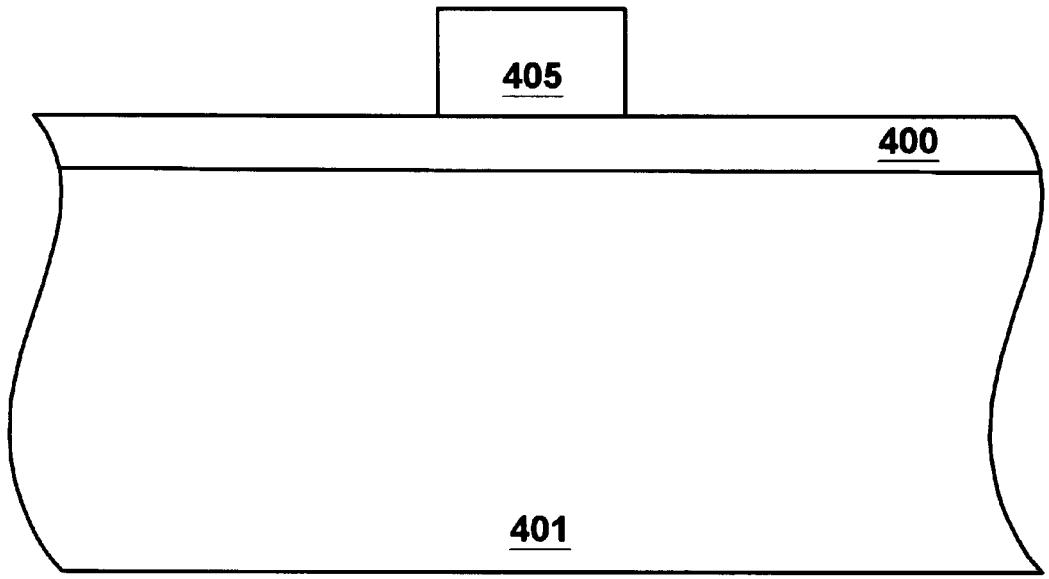
FIG. 4F shows a representative semiconductor substrate after the performance of step 308 of FIG. 3 in accordance with one embodiment of the present claimed invention.

Referring now to FIG. 4F, the semiconductor substrate of FIG. 4E is shown after step 308 has removed the remaining portion of layer of inorganic anti-reflective coating 403.

Continuing with FIG. 3, in one embodiment, the etching device is an asher. That is, the semiconductor substrate is placed into an asher and etching steps 307 and 308 are sequentially performed ashing steps that operate to remove the layer of photoresist and the layer of inorganic anti-reflective coating.

Because of the highest selectivity provided by the present invention, in a typical process performed according to steps 301–308, only 33 Angstroms of oxide would be sacrificed from exposed $SiO_2$ in order to remove 600 Angstroms of inorganic anti-reflective coating. Such a negligible oxide loss is not deleterious to the overall integration of the process of steps 301–308 into a semiconductor device manufacturing process. In fact, the resulting oxide loss beneficially removes surface damage resulting from the metal etch and resist strip processes.

The etch process of the present invention provides a highly selective etch using a simple etch process. The highest selectivity of fluorine atoms to etching the inorganic anti-reflective coating is probably due to a relatively high concentration of reaction sites (dangling Si bonds and hydrogen-terminated silicon atoms). This results in the removal of a negligible amount of $SiO_2$ during the time required to remove the SiON film.

The etch process of the present invention is superior to other prior art processes, such as prior art processes that take advantage of the high F-atom etch rate selectivity between $Si_3N_4$ and $SiO_2$. In such prior art processes, highly selective etching of silicon nitride is achieved by careful manipulation of the $NF_3$—$O_2$ gas chemistry. Such prior art processes are difficult to achieve and are expensive due to their complexity and the requirement that a dedicated etch chamber be used. In some of these prior art processes oxygen gas is added into the etch environment to suppress the etch rate of stochiometric $SiO_2$. In contrast, the etch process of the present invention is a much simpler process, yielding lower cost and increased throughput as compared to such complex prior art processes.

Figure 5:
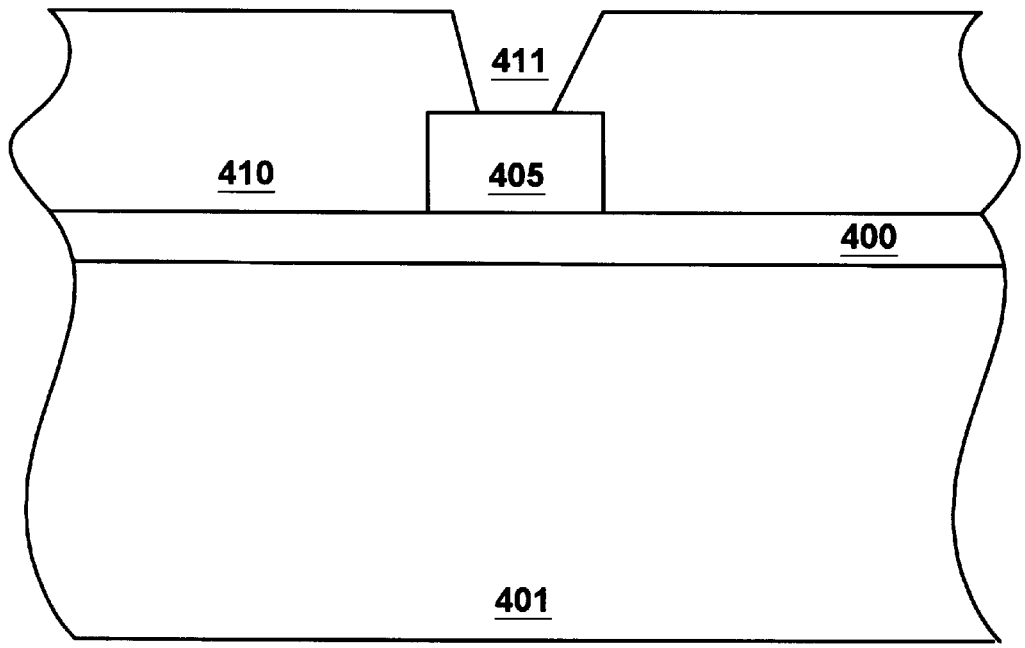
FIG. 5 shows a representative semiconductor substrate after the performance of steps 301–308 of FIG. 3 and after a dielectric layer is deposited and etched to form a via in accordance with one embodiment of the present claimed invention.
Figure 6:
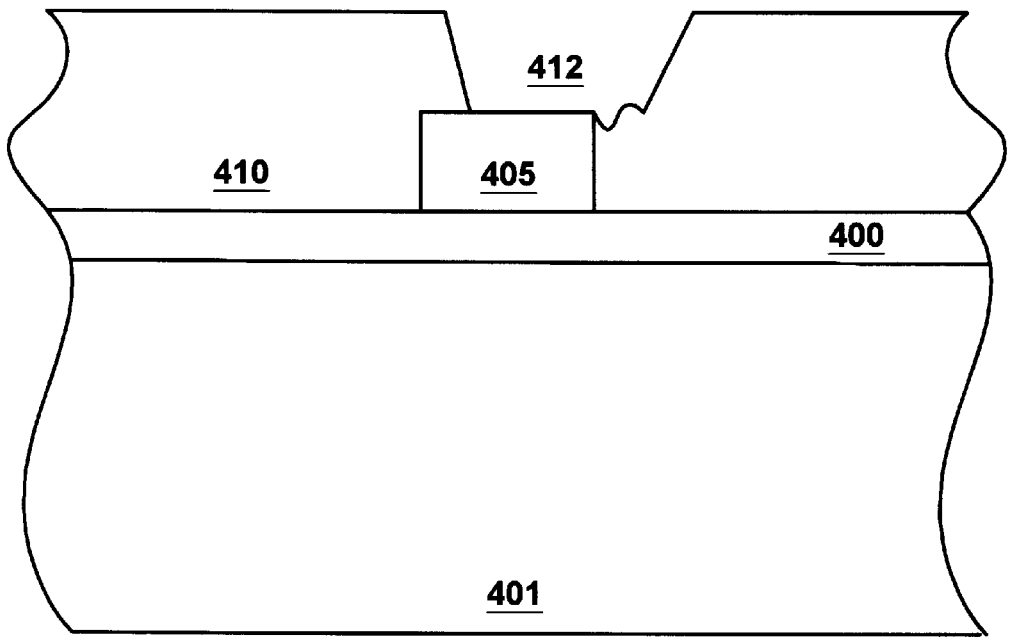
FIG. 6 shows a representative semiconductor substrate after the performance of steps 301–308 of FIG. 3 and after a dielectric layer is deposited and etched to form an overhanging via in accordance with one embodiment of the present claimed invention.

FIGS. 5–6 show the semiconductor substrate of the present invention after a layer of dielectric material, shown as dielectric layer 410, is deposited, masked, and etched to so as to form via opening 411. Since the remaining portion of layer of inorganic anti-reflective coating 403 and photoresist 404 have been removed (steps 301–308 of the present invention), there is no need to perform an extensive and/or complex etch step to form a via, as is required by prior art processes. Thus, the present invention result in a via 411 that is uniform.

Referring now to FIG. 6, the present invention allows for forming a uniform via, even in a situation where the via opening is not aligned properly with the interconnect. In the example shown in FIG. 6, via 412 is not properly aligned with interconnect 401, forming what is commonly referred to as an overhanging via. Since the remaining portion of layer of inorganic anti-reflective coating 403 and photoresist 404 have been removed (steps 301–308 of the present invention), a standard via etch step results in a via 412 that is uniform. That is, via 412 does not extend significantly below the top of interconnect 405 and the walls of via 412 are evenly etched.

Thus, the present invention provides a method for fabricating semiconductor devices that allows for the integration of anti-reflective coatings into the fabrication process. Also, the present invention provides a method for fabricating semiconductor devices that allows for the efficient and inexpensive removal of anti-reflective coatings that results in minimal disruption of the fabrication process. Also, the present invention provides a method for removing a layer of anti-reflective coating that does not result in undesired removal of $SiO_2$.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, to thereby enable others skilled in the art best to utilize the invention and various embodiments with various modifications suited to the particular use contemplated. It is intended that the scope of the invention be defined by the claims appended hereto and their equivalents.

What is claimed is:

1. A method for removing a layer of inorganic anti-reflective coating disposed on a semiconductor substrate, said method comprising the steps of:

a) disposing said semiconductor substrate in an etching environment; and b) performing an etching step by introducing a precursor chemical into said etching environment, said precursor chemical adapted to be converted to fluorine atoms, said etching step adapted to remove said layer of inorganic anti-reflective coating.

2. The method for removing a layer of inorganic anti-reflective coating of claim 1 wherein said precursor chemical comprises $NF_3$ gas.

3. The method for removing a layer of inorganic anti-reflective coating of claim 1 wherein step b) further comprises the step of:

introducing an inert carrier gas into said etching chamber.

4. The method for removing a layer of inorganic anti-reflective coating of claim 3 wherein said inert carrier gas comprises helium.

5. The method for removing a layer of inorganic anti-reflective coating of claim 1 wherein said wherein said etching environment is produced in an asher.

6. The method for removing a layer of inorganic anti-reflective coating of claim 1 wherein said etching environment has a pressure of from 0.0001 to 1.7 torr.

7. The method for removing a layer of inorganic anti-reflective coating of claim 6 wherein said etching environment is an environment that does not include any introduction of oxygen gas.

8. A method for removing a layer of inorganic anti-reflective coating and a layer of photoresist from a semiconductor substrate on which a photoresist layer and a layer of inorganic anti-reflective coating are disposed, said method comprising the steps of:

a) disposing said semiconductor substrate in an etching device;

b) performing a first etching step including the introduction of a first precursor chemical into said etching device, said first precursor chemical adapted to be converted to atoms adapted to remove said photoresist layer; and c) performing a second etching step by introducing a second precursor chemical into said etching device, said second precursor chemical adapted to be converted to fluorine atoms, said second etching step adapted to remove said layer of inorganic anti-reflective coating.

9. The method for removing a layer of inorganic anti-reflective coating and a layer of photoresist of claim 8 wherein said second precursor chemical comprises $NF_3$ gas.

10. The method for removing a layer of inorganic anti-reflective coating and a layer of photoresist of claim 9 wherein step c) further comprises the step of:

introducing an inert carrier gas into said etching chamber.

11. The method for removing a layer of inorganic anti-reflective coating and a layer of photoresist of claim 10 wherein said inert carrier gas comprises helium.

12. The method for removing a layer of inorganic anti-reflective coating and a layer of photoresist of claim 8 wherein said first precursor chemical comprises oxygen gas.

13. The method for removing a layer of inorganic anti-reflective coating and a layer of photoresist of claim 8 wherein said etching device comprises an asher.

14. The method for removing a layer of inorganic anti-reflective coating and a layer of photoresist of claim 13 wherein said asher includes a plasma reactor.

15. The method for removing a layer of inorganic anti-reflective coating and a layer of photoresist of claim 10 wherein said second etching step is performed at a pressure of from 0.0001 to 1.7 torr.

16. The method for removing a layer of inorganic anti-reflective coating and a layer of photoresist of claim 8 wherein said second etching step is performed in an environment that does not include the introduction of oxygen gas.

17. A method for fabricating a semiconductor device comprising:

depositing a first layer of metal over a semiconductor substrate;

depositing a layer of inorganic anti-reflective coating over said first layer of metal;

depositing a layer of photoresist over said anti-reflective coating;

patterning said layer of photoresist;

performing a first etching step so as to selectively etch said layer of photoresist, said layer of inorganic anti-reflective coating and said first layer of metal;

disposing said semiconductor substrate into an etching device;

performing a second etching step including the introduction of a first precursor chemical into said etching device, said first precursor chemical adapted to be converted to atoms adapted to remove said layer of photoresist; and performing a third etching step by introducing a second precursor chemical into said etching device, said second precursor chemical adapted to be converted to fluorine atoms, said third etching step adapted to remove said layer of inorganic anti-reflective coating.

18. The method for fabricating a semiconductor device of claim 17 wherein said second precursor chemical comprises $NF_3$ gas.

19. The method for fabricating a semiconductor device of claim 18 wherein said etching device comprises an asher.

20. The method for fabricating a semiconductor device of claim 19 wherein said third etching step is performed at a pressure of from 0.0001 to 1.7 torr.

21. The method for fabricating a semiconductor device of claim 19 wherein said third etching step is performed in an environment that does not include the addition of oxygen gas.

* * * * *